United States Patent
Fuke et al.

(10) Patent No.: US 11,467,494 B2
(45) Date of Patent: Oct. 11, 2022

(54) POSITIVE TYPE PHOTOSENSITIVE POLYSILOXANE COMPOSITION

(71) Applicant: Merck Patent GmbH, Darmstadt (DE)

(72) Inventors: Takashi Fuke, Kakegawa (JP); Naofumi Yoshida, Yokohama (JP); Atsuko Noya, Kakegawa (JP)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 17/439,692

(22) PCT Filed: Mar. 12, 2020

(86) PCT No.: PCT/EP2020/056648
§ 371 (c)(1),
(2) Date: Sep. 15, 2021

(87) PCT Pub. No.: WO2020/187685
PCT Pub. Date: Sep. 24, 2020

(65) Prior Publication Data
US 2022/0146938 A1 May 12, 2022

(30) Foreign Application Priority Data

Mar. 15, 2019 (JP) .............................. JP2019-048366
Jul. 9, 2019 (JP) .............................. JP2019-127509
Nov. 1, 2019 (JP) .............................. JP2019-200105

(51) Int. Cl.
*G03F 7/075* (2006.01)
*C09D 183/06* (2006.01)

(52) U.S. Cl.
CPC .......... *G03F 7/0757* (2013.01); *C09D 183/06* (2013.01)

(58) Field of Classification Search
CPC ....... G03F 7/0757; G03F 7/022; C09D 183/04; C09D 183/06
See application file for complete search history.

(56) References Cited

U.S. PATENT DOCUMENTS

| 3,350,309 A | 10/1967 | Buehler | |
|---|---|---|---|
| 2019/0077961 A1* | 3/2019 | Takahashi | G03F 7/0233 |
| 2021/0171718 A1* | 6/2021 | Yoshida | G03F 7/0233 |

FOREIGN PATENT DOCUMENTS

| EP | 3255494 A1 | 12/2017 | |
|---|---|---|---|
| JP | 2011-002517 A | 1/2011 | |
| WO | WO-2018224414 A1 * | 12/2018 | C09D 183/04 |

OTHER PUBLICATIONS

International Search Report and Written Opinion received for PCT Patent Application No. PCT/EP2020/056648, dated Jun. 24, 2020, 7 pages.

* cited by examiner

Primary Examiner — Amanda C. Walke
(74) Attorney, Agent, or Firm — Faegre Drinker Biddle & Reath LLP (57) ABSTRACT

[Problem] To provide a positive type photosensitive polysiloxane composition that can manufacture a cured film having a high surface smoothness, in which generation of wrinkles is suppressed even without adding a curing auxiliary or performing flood exposure. [Means for Solution] A positive type photosensitive polysiloxane composition comprising (I) a polysiloxane, (II) a carboxylic acid compound that is a monocarboxylic acid or a dicarboxylic acid, of 200 to 50,000 ppm based on the total mass of the composition, (III) a diazonaphthoquinone derivative, and (IV) a solvent, and a method for manufacturing a cured film using the composition.

11 Claims, 2 Drawing Sheets

POSITIVE TYPE PHOTOSENSITIVE POLYSILOXANE COMPOSITION

CROSS-REFERENCE TO RELATED APPLICATIONS

This application is a national stage application (under 35 U.S.C. § 371) of PCT/EP2020/056648, filed Mar. 12, 2020, which claims benefit of Japanese Application Nos. 2019-248366, 2019-127509, and 2019-200105, filed Mar. 15, 2019, Jul. 9, 2019, and Nov. 1, 2019 respectively, all of which are incorporated herein by reference in their entirety.

BACKGROUND OF THE INVENTION

Technical Field

The present invention relates to a positive type photosensitive polysiloxane composition. Further, the present invention relates to a method for manufacturing a cured film using the same and an electronic device comprising the cured film.

Background Art

In recent years, various proposals have been made for further improving light utilization efficiency and energy saving in optical devices such as displays, light emitting diodes, and solar cells. For example, in a liquid crystal display, a method for increasing the aperture ratio of a display device by forming a transparent planarization film on a TFT device and forming pixel electrodes on the planarization film is known.

As the material for such a planarization film for a TFT substrate, a material combining an acrylic resin with a quinonediazide compound is known. Since these materials have planarizing properties and photosensitivity, contact holes and other patterns can be formed. However, as resolution and frame frequency are increased, planarization becomes severe due to more complicated wiring, so that it becomes difficult for these materials to cope with this problem.

As a material having high heat resistance and high transparency, polysiloxane, in particular silsesquioxane, is known. Silsesquioxane is polymer composed of a trifunctional siloxane structural unit $RSi(O_{1.5})$ and is an intermediate existence between inorganic silica ($SiO_2$) and organic silicone ($R_2SiO$) in terms of chemical structure. While it is soluble in organic solvent, the cured product thereof is a specific compound having high heat resistance, which is characteristic of inorganic silica.

A pattern is formed by exposure and development using a positive type photosensitive composition comprising such polysiloxane and a photosensitizer, and a cured film can be formed by heating. In the cured film thus formed, the film surface does not sometimes become flat and wrinkles may occur. Then, in order to suppress generation of wrinkles, a curing auxiliary is sometimes added, or flood exposure is sometimes performed after exposure and development.

PRIOR ART DOCUMENTS

Patent Documents

[Patent document 1] JP 2011-2517A

SUMMARY OF THE INVENTION

Problems to be Solved by the Invention

The present invention has been made on the basis of the above-described circumstances, and it is an object of the present invention to provide a positive type photosensitive polysiloxane composition that can manufacture a cured film having high surface smoothness, in which generation of wrinkles is suppressed even without adding a curing auxiliary or performing flood exposure. Further, it is an object of the present invention to provide a method for manufacturing a cured film using the same.

Means for Solving the Problems

The positive type photosensitive polysiloxane composition according to the present invention comprises:
(I) a polysiloxane,
(II) a carboxylic acid compound that is a monocarboxylic acid or a dicarboxylic acid, of 200 to 50,000 ppm based on the total mass of the composition,
(III) a diazonaphthoquinone derivative, and
(IV) a solvent.

Further, the method for manufacturing a cured film according to the present invention comprises the following processes:
(1) applying the composition according to the present invention on a substrate to form a composition layer;
(2) exposing the composition layer;
(3) developing with an alkaline developer to form a pattern; and
(4) heating the obtained pattern.

Further, the electronic device according to the present invention comprises the cured film manufactured by the above-described method.

Effects of the Invention

When the positive type photosensitive polysiloxane composition according to the present invention is used, a cured film having high surface smoothness, in which generation of wrinkles is suppressed even without adding a curing auxiliary or performing flood exposure, can be manufactured. The obtained film has high photosensitivity and can contribute to attain high throughput of the manufacturing process. Further, the pattern shape of the cured film can also be made into a shape, which is a shape desirable for subsequent processes and in which an opening part is gentle. Then, since the obtained cured film is excellent also in flatness and electrical insulation properties, it can be suitably used as various film-forming materials, such as a planarization film for a thin film transistor (TFT) substrate used for a backplane of a display such as a liquid crystal display device or an organic EL display device, an interlayer insulating film for a semiconductor device, an insulating film or a transparent protective film, which is in a solid state imaging device, an anti-reflection film, an anti-reflection plate, an optical filter, a high-intensity light-emitting diode, a touch panel, a solar cell and the like, and further as an optical device, such as an optical waveguide.

DETAILED DESCRIPTION OF THE INVENTION

Mode for Carrying Out the Invention

Embodiments of the present invention are described below in detail. In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "And/or" includes a combination of all elements and also includes single use of the element.

In the present specification, when a numerical range is indicated using "to" or "-", it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, the description such as "$C_{x\text{-}y}$", "$C_x\text{-}C_y$" and "$C_x$" means the number of carbons in the molecule or substituent group. For example, $C_{1\text{-}6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when polymer has a plural types of repeating units, these repeating units copolymerize. These copolymerization are any of alternating copolymerization, random copolymerization, block copolymerization, graft copolymerization, or a mixture of any of these.

In the present specification, "%" represents mass % and "ratio" represents ratio by mass.

In the present specification, Celsius is used as the temperature unit. For example, 20 degrees means 20 degrees Celsius.

Positive Type Photosensitive Polysiloxane Composition

The positive type photosensitive polysiloxane composition according to the present invention (hereinafter sometimes referred to as the composition) comprises (I) a polysiloxane, (II) a carboxylic acid compound, (III) a diazonaphthoquinone derivative, and (IV) a solvent.

Hereinafter, each component contained in the composition according to the present invention is described in detail.

(I) Polysiloxane

The structure of polysiloxane used in the present invention is not particularly limited and can be selected from any ones according to the purpose. Depending on the number of oxygen atoms bonded to a silicon atom, the skeleton structure of polysiloxane can be classified as follows: a silicone skeleton (the number of oxygen atoms bonded to a silicon atom is 2), a silsesquioxane skeleton (the number of oxygen atoms bonded to a silicon atom is 3), and a silica skeleton (the number of oxygen atoms bonded to a silicon atom is 4). In the present invention, any of these may be used. The polysiloxane molecules may contain multiple combinations of these backbone structures.

Preferably, the polysiloxane used in the present invention comprises a repeating unit represented by the following formula (Ia):

(wherein, $R^{Ia}$ is hydrogen, or a $C_{1\text{-}30}$, linear, branched or cyclic, saturated or unsaturated aliphatic hydrocarbon group or aromatic hydrocarbon group, the aliphatic hydrocarbon group and the aromatic hydrocarbon group are each unsubstituted or substituted with fluorine, hydroxy or alkoxy, and in the aliphatic hydrocarbon group and the aromatic hydrocarbon group, methylene is not replaced, or one or more methylene are replaced with oxy, amino, imino or carbonyl, provided that $R^{Ia}$ is not hydroxy or alkoxy).

In addition, the above-described methylene includes a terminal methyl.

Further, the above-described "substituted with fluorine, hydroxy or alkoxy" means that a hydrogen atom directly bonded to a carbon atom in an aliphatic hydrocarbon group and aromatic hydrocarbon group is replaced with fluorine, hydroxy or alkoxy. In the present specification, the same applies to other similar descriptions.

In the repeating unit represented by the formula (Ia), $R^{Ia}$ includes, for example, (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, (vi) a nitrogen-containing group having an amino or imide structure, such as isocyanate and amino, and (vii) an oxygen-containing group having an epoxy structure, such as glycidyl, or an acryloyl structure or a methacryloyl structure. It is preferably methyl, ethyl, propyl, butyl, pentyl, hexyl, phenyl, tolyl, glycidyl and isocyanate. As fluoroalkyl, perfluoroalkyl is preferred, and trifluoromethyl and pentafluoroethyl are particularly preferred. The compound wherein $R^{Ia}$ is methyl is preferred, since raw material thereof is easily obtained, it has high film hardness after curing and it has high chemical resistance. Further, the compound wherein $R^{Ia}$ is phenyl is preferred, since it increases solubility of the polysiloxane in the solvent and the cured film becomes to hardly crack. Further, it is preferred that $R^{Ia}$ has hydroxy, glycidyl, isocyanate or amino, since the adhesion to the substrate is improved.

The polysiloxane used in the present invention can further comprise a repeating unit represented by the following formula (Ib):

(Ib)

(wherein, $R^{Ib}$ is a group obtained by removing plural hydrogen from a nitrogen and/or oxygen-containing cycloaliphatic hydrocarbon compound having an amino group, an imino group and/or a carbonyl group).

In the formula (Ib), $R^{Ib}$ is preferably a group obtained by removing plural hydrogen, preferably two or three hydrogen, from preferably a nitrogen-containing aliphatic hydrocarbon ring having an imino group and/or a carbonyl group, more preferably a 5-membered or 6-membered ring containing nitrogen as a member. For example, groups obtained by removing two or three hydrogen from piperidine, pyrrolidine or isocyanurate. $R^{Ib}$ connects Si each other included in plural repeating units.

The polysiloxane used in the present invention can further comprise a repeating unit represented by the following formula (Ic).

(Ic)

When the blending ratio of the repeating units represented by the formulas (Ib) and (Ic) is high, photosensitivity of the composition decreases, compatibility with solvents and additives decreases, and the film stress increases, so that cracks sometimes easily generate. Therefore, it is preferably 40 mol % or less with, and more preferably 20 mol % or less, based on the total number of the repeating units of polysiloxane.

The polysiloxane used in the present invention can further comprise a repeating unit represented by the following formula (Id):

(Id)

(wherein,

$R^{Id}$ each independently represents hydrogen, or a $C_{1-30}$, linear, branched or cyclic, saturated or unsaturated aliphatic hydrocarbon group or aromatic hydrocarbon group;

in the aliphatic hydrocarbon group and the aromatic hydrocarbon group, methylene is not replaced or replaced with oxy, imide or carbonyl, and the carbon atom is unsubstituted or substituted with fluorine, hydroxy or alkoxy).

In the repeating unit represented by the formula (Id), $R^{Id}$ includes, for example, (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, (vi) a nitrogen-containing group having an amino or imide structure, such as isocyanate and amino, and (vii) an oxygen-containing group having an epoxy structure, such as glycidyl, or an acryloyl structure or a methacryloyl structure. It is preferably methyl, ethyl, propyl, butyl, pentyl, hexyl, phenyl, tolyl, glycidyl and isocyanate. As fluoroalkyl, perfluoroalkyl is preferred, and trifluoromethyl and pentafluoroethyl are particularly preferred. The compound wherein $R^{Id}$ is methyl is preferred, since raw material thereof is easily obtained, it has high film hardness after curing and it has high chemical resistance. Further, the compound wherein $R^{Id}$ is phenyl is preferred, since it increases solubility of the polysiloxane in the solvent and the cured film becomes to hardly crack. Further, it is preferred that $R^{Id}$ has hydroxy, glycidyl, isocyanate or amino, since the adhesion to the substrate is improved.

By having the repeating unit of the above formula (Id), the polysiloxane according to the present invention can partially have a linear structure. However, since heat resistance is reduced, it is preferable that portions of linear structure are few. Specifically, the repeating unit of the formula (Id) is preferably 30 mol % or less based on the total number of the repeating units of the polysiloxane.

Further, the polysiloxane used in the present invention can further comprises a repeating unit represented by the following formula (Ie):

(wherein, where, n is an integer of 1 to 3, and
$R^{Ie}$ each independently represents hydrogen, methyl or ethyl).

In the formula (Ie), $L^{Ie}$ is preferably $—(CR^{Ie}_2)_n—$, and $R^{Ie}$ is identical or different in one repeating unit or in the polysiloxane molecule. All $R^{Ie}$ in one molecule are preferably identical, and it is preferred that all are hydrogen.

The polysiloxane used in the present invention can contain two or more types of repeating units. For example, it can contain three types of repeating units, which have repeating units represented by the formula (Ia) in which $R^{Ia}$ is methyl or phenyl and a repeating unit represented by the formula (Ic).

The composition according to the present invention can contain two or more types of polysiloxane. For example, as the first type, polysiloxane containing any of the repeating units of the formulae (Ia) to (Id) described above can be used, and as the second type, polysiloxane containing the repeating unit of the formula (Ie) and the repeating unit other than that of the formula (Ie) (preferably the repeating units of the formulae (Ia), (Ib) and/or (Id)) can be used.

Preferably, one or more polysiloxane comprises a repeating unit, which is a bulky group, in at least one of $R^{Ia}$ of the formula (Ia), $R^{Ib}$ of the formula (Ib) and/or $R^{Id}$ of the formula (Id), and it is further preferred to use polysiloxane comprising a repeating unit in which $R^{Ia}$ of the formula (Ia) is a bulky, $C_{3-20}$, saturated or unsaturated, cyclic aliphatic hydrocarbon group or an aromatic hydrocarbon group (for example, phenyl, naphthyl and anthracene) and the repeating unit of the formula (Ie). Since there is a tendency that wrinkles are likely to occur when a bulky group is present, suppression of wrinkles by the present invention is effectively exhibited, and in addition to this, by including the repeating unit of the formula (Ie), the taper angle control of the pattern can further become possible, so that this is particularly advantageous.

The ratio of the total number of the repeating unit (Ie) and the repeating unit (Ia) to the total number of the repeating units contained in the polysiloxane is preferably 60 mol % or more, and more preferably 70 mol % or more. Further, it is preferred that (Ia) is 20 to 95 mol % and (Ie) is 5 to 40 mol %.

Further, the total ratio of the repeating units (Ia), (Ib) and (Id) containing the above bulky group is preferably 10 mol % or more based on the total number of repeating units contained in the polysiloxane.

The polysiloxane used in the present invention has a structure in which the above-described repeating units are bonded, but preferably has a silanol at its terminal. Such a silanol group is one in which $—O_{0.5}H$ is bonded to the bonding hand of the above-described repeating units or blocks.

The mass average molecular weight of the polysiloxane used in the present invention is not particularly limited. However, the higher the molecular weight is, the more coating properties tends to be improved. On the other hand, the lower the molecular weight is, the less the synthesis conditions are limited, the easier the synthesis is, and the more difficult the polysiloxane having a very high molecular weight is synthesized. For these reasons, the mass average molecular weight of the polysiloxane is usually 500 or more and 25,000 or less, and preferably 1,000 or more and 20,000 or less from the viewpoint of solubility in an organic solvent and solubility in an alkali developer. Here, the mass average molecular weight means a mass average molecular weight in terms of polystyrene, which can be measured by the gel permeation chromatography based on polystyrene.

The polysiloxane used in the present invention is contained in a composition having positive type photosensitivity, a cured film is formed through coating on a substrate, imagewise exposure and development. At this time, it is necessary that a difference in solubility occurs between the exposed area and the unexposed area, and the coating film in the exposed area should have above certain solubility in a developer. For example, it is considered that a pattern can be formed by exposure-development if dissolution rate of a pre-baked coating film in a 2.38 mass % tetramethylammonium hydroxide (hereinafter sometimes referred to as TMAH) aqueous solution (hereinafter sometimes referred to as alkali dissolution rate or ADR, which is described later in detail) is 50 Å/sec or more. However, since the required solubility varies depending on the thickness of the cured film to be formed and the development conditions, polysiloxane should be appropriately selected according to the development conditions. Although it varies depending on the type and amount of the diazonaphthoquinone derivative contained in the composition, for example, if the film thickness is 0.1 to 100 μm (1,000 to 1,000,000 Å), the dissolution rate in the 2.38 mass % TMAH aqueous solution is preferably 50 to 5,000 Å/sec, and more preferably 200 to 3,000 Å/sec.

As the polysiloxane used in the present invention, polysiloxane having any ADR within the above range can be selected depending on the application and required characteristics. Further, by combining some polysiloxane having different ADR, a mixture having a desired ADR can be prepared.

Polysiloxane having different alkali dissolution rates and mass average molecular weights can be prepared by changing catalyst, reaction temperature, reaction time or polymer. Using a combination of polysiloxane having different alkali dissolution rates, it is possible to improve reduction of remaining insoluble matter after development, reduction of pattern reflow, pattern stability, and the like.

Such polysiloxane includes, for example:

(M) polysiloxane whose film after pre-baked is soluble in a 2.38 mass % TMAH aqueous solution and has dissolution rate of 200 to 3,000 Å/sec.

Further, if necessary, a composition having a desired dissolution rate can be obtained by mixing with:

(L) polysiloxane whose film after pre-baked is soluble in a 5 mass % TMAH aqueous solution and has dissolution rate of 1,000 Å/sec or less, or (H) polysiloxane whose film after pre-baked has dissolution rate in a 2.38 mass % TMAH aqueous solution of 4,000 Å/sec or more.

Measurement of Alkaline Dissolution Rate (ADR) and Calculation Method Thereof

Using a TMAH aqueous solution as an alkaline solution, the alkali dissolution rate of polysiloxane or a mixture thereof is measured and calculated as described below.

Polysiloxane is diluted with PGMEA so as to be 35 mass % and dissolved while stirring at room temperature with a stirrer for 1 hour. In a clean room under an atmosphere of temperature of 23.0 f 0.5° C. and humidity of 50 f 5.0%, using a pipette, 1 cc of the prepared polysiloxane solution is dropped on the center area of a 4-inch silicon wafer having thickness of 525 μm, spin-coated so as to be a thickness of 2 f 0.1 μm, and then the resultant film is heated on a hot plate at 100° C. for 90 seconds to remove the solvent. The film thickness of the coating film is measured with a spectroscopic ellipsometer (manufactured by J.A. Woollam).

Next, the silicon wafer having this film is gently immersed in a glass petri dish having a diameter of 6 inches, into which 100 ml of a TMAH aqueous solution adjusted to 23.0 f 0.1° C. and having a predetermined concentration is put, then allowed to stand, and the time until the film disappeared is measured. The dissolution rate is determined by dividing by the time until the film in the area 10 mm of inside from the wafer edge disappears. In the case that the dissolution rate is remarkably slow, the wafer is immersed in a TMAH aqueous solution for a certain period and then heated for 5 minutes on a hot plate at 200° C. to remove moisture taken in the film during the dissolution rate measurement. Thereafter, film thickness is measured, and the dissolution rate is calculated by dividing the variation amount between before and after the immersion, by the immersion time. The above measurement method is performed 5 times, and the average of the obtained values is taken as the dissolution rate of the polysiloxane.

Method for Synthesizing Polysiloxane

Although the method for synthesizing the polysiloxane used in the present invention is not particularly limited, it can be obtained, for example, by hydrolysis and polymerization of a silane monomer represented by the following formula, if necessary, in the presence of an acidic catalyst or a basic catalyst:

$$R^{ia}-Si-(OR^{ia'})_3 \quad (ia)$$

(wherein, $R^{ia}$ is hydrogen, or a $C_{1-30}$, linear, branched or cyclic, saturated or unsaturated aliphatic hydrocarbon group or aromatic hydrocarbon group, in the aliphatic hydrocarbon group and the aromatic hydrocarbon group, methylene is not replaced or replaced with oxy, imide or carbonyl, and the carbon atom is unsubstituted or substituted with fluorine, hydroxy or alkoxy, and $R^{ia'}$ is linear or branched $C_{1-6}$ alkyl).

In the formula (ia), preferable $R^{ia'}$ includes methyl, ethyl, n-propyl, isopropyl, n-butyl and the like. In the formula (ia), a plurality of $R^{ia'}$ are contained, and each $R^{ia'}$ can be identical or different.

Preferred $R^{ia'}$ is the same as the above-described preferred $R^{Ia}$.

Exemplified embodiments of the silane monomer represented by the formula (ia) include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, and 3,3,3-trifluoropropyltrimethoxysilane. Among these, methyltrimethoxysilane, methyltriethoxysilane, methyltripropoxysilane, and phenyltrimethoxysilane are preferable. Two or more types of silane monomers represented by the formula (ia) can be combined.

Further, a silane monomer represented by the following formula (ic) can be combined. When the silane monomer represented by the formula (ic) is used, polysiloxane comprising the repeating unit (Ic) can be obtained.

$$Si(OR^{ic'})_4 \quad (ic)$$

wherein, $R^{ic'}$ is linear or branched, $C_{1-6}$ alkyl.

In the formula (ic), preferable $R^{ic'}$ includes methyl, ethyl, n-propyl, isopropyl, n-butyl and the like. In the formula (ic), a plurality of $R^{ic'}$ are included, and each $R^{ic'}$ can be identical or different.

Exemplified embodiments of the silane monomer represented by the formula (ic) include tetramethoxysilane, tetraethoxylane, tetraisopropoxy-silane, tetra n-butoxysilane and the like.

A silane monomer represented by the following formula (ib) can be further combined.

$$R^{ib}-Si-(OR^{ib'})_3 \quad (ib)$$

wherein, $R^{ib'}$ is linear or branched $C_{1-6}$ alkyl, and examples thereof include methyl, ethyl, n-propyl, isopropyl, n-butyl, and the like. A plurality of $R^{ib'}$ are contained in one monomer, and each $R^{ib'}$ can be identical or different.

$R^{ib}$ is a group obtained by removing plural, preferably two or three, hydrogen from a nitrogen and/or oxygen-containing cyclic aliphatic hydrocarbon compound having an amino group, an imino group and/or a carbonyl group. Preferred $R^{ib}$ is the same as the above-described preferred $R^{Ib}$.

Exemplified embodiments of the silane monomer represented by the formula (ib) include tris-(3-trimethoxysilylpropyl)isocyanurate, tris-(3-triethoxysilylpropyl)isocyanurate, tris-(3-trimethoxysilylethyl)isocyanurate and the like.

Furthermore, a silane monomer represented by the following formula (id) can be combined. When the silane monomer represented by the formula (id) is used, polysiloxane containing the repeating unit (Id) can be obtained.

$$(R^{id})_2-Si-(OR^{id'})_2 \quad (id)$$

wherein, $R^{id'}$ is each independently a linear or branched $C_{1-6}$ alkyl, and examples thereof include methyl, ethyl, n-propyl, isopropyl, n-butyl, and the like. A plurality of $R^{id}$ are contained in one monomer, and each $R^{id}$ can be identical or different, $R^{id}$ each independently represents hydrogen, or a $C_{1-30}$, linear, branched or cyclic, saturated or unsaturated aliphatic hydrocarbon group or aromatic hydrocarbon group, and in the aliphatic hydrocarbon group and aromatic hydrocarbon group, methylene is not replaced or replaced with oxy, amino, imino or carbonyl, and the carbon atom is unsubstituted or substituted with fluorine, hydroxy or alkoxy. Preferred $R^{id}$ is the same as the above-described preferred $R^{Id}$.

Furthermore, a silane monomer represented by the following formula (ie) can be combined.

(OR$^{ie'}$)$_3$—Si-L$^{ie}$-Si—(OR$^{ie'}$)$_3$ (ie)

In the formula (ie),
R$^{ie'}$ is each independently a linear or branched C$_{1-6}$ alkyl, and examples thereof include methyl, ethyl, n-propyl, isopropyl, n-butyl, and the like.

L$^{ie}$ is —(CR$^{ie}_2$)$_n$— or and preferably —(CR$^{ie}_2$)$_n$—. Here,
n is each independently an integer of 1 to 3, and R$^{ie}$ is each independently hydrogen, methyl or ethyl.

(II) Carboxylic Acid Compound

The carboxylic acid compound used in the present invention is 200 to 50,000 ppm of monocarboxylic acid or dicarboxylic acid based on the total mass of the composition.

Preferably, the first acid dissociation constant pKa$_1$ of the monocarboxylic acid is 5.0 or less. Preferably, the first acid dissociation constant pKa$_1$ of the dicarboxylic acid is 4.0 or less, and more preferably 3.5 or less.

Preferably, the monocarboxylic acid is represented by the formula (i):

R$^i$—COOH (i)

wherein,
R$^i$ is hydrogen, or a saturated or unsaturated C$_{1-4}$ hydrocarbon group, and more preferably a C$_{1-3}$ hydrocarbon group.

Examples of the monocarboxylic acid used in the present invention include acetic acid, formic acid and acrylic acid, and preferably acetic acid.

Preferably, the dicarboxylic acid is represented by the formula (ii):

HOOC-L-COOH (ii)

wherein, L is
a single bond,
a C$_{1-6}$, unsubstituted alkylene, hydroxy-substituted alkylene or amino-substituted alkylene,
a C$_{2-4}$, substituted or unsubstituted alkenylene,
a C$_{2-4}$, substituted or unsubstituted alkynylene, or
a C$_{6-10}$, substituted or unsubstituted arylene.

Here, in the present invention, alkenylene means a divalent group having one or more double bonds. Similarly, alkynylene means a divalent group having one or more triple bonds.

Preferably, L is
a single bond,
a C$_{2-4}$, hydroxy-substituted or unsubstituted alkylene,
a C$_{2-4}$ unsubstituted alkenylene having one C=C bond, or
a C$_{6-10}$ unsubstituted arylene, and
more preferably, L is a single bond, a C$_{1-2}$ unsubstituted alkylene, vinylene, hydroxyethylene or phenylene.

Exemplified embodiments of the dicarboxylic acid used in the present invention include oxalic acid, maleic acid, fumaric acid, o-phthalic acid, succinic acid, glutaconic acid, aspartic acid, glutamic acid, malic acid, itaconic acid, 3-aminohexanedioic acid and malonic acid, and preferably oxalic acid, maleic acid, fumaric acid, o-phthalic acid, malic acid or malonic acid.

The carboxylic acid compound used in the present invention is more preferably a dicarboxylic acid, and above all, one can take a cyclic structure by intramolecular dehydration condensation is particularly preferable. Examples of such a dicarboxylic acid include oxalic acid, maleic acid, succinic acid, o-phthalic acid, glutaconic acid, and itaconic acid. Above all, dicarboxylic acids having a temperature at which intramolecular dehydration condensation reaction occurs at 100° C. to 250° C. are preferable, and maleic acid, succinic acid and oxalic acid are further preferable.

The carboxylic acid compound can be used in any combination of any two or more kinds thereof.

In the composition according to the present invention, the content of the carboxylic acid compound is 200 to 50,000 ppm, more preferably 300 to 30,000 ppm, and further preferably 500 to 30,000 ppm, based on the total mass of the composition. If it is more than 50,000 ppm, photosensitivity is lowered, so that this is not preferable.

When an organic developer (for example, a TMAH aqueous solution) is used in the developing process, the content of the compound (II) is preferably 300 to 10,000 ppm, and more preferably 500 to 5,000 ppm.

When an inorganic developer (for example, a KOH aqueous solution) is used in the developing process, the content of the compound (II) is preferably 1,000 to 30,000 ppm, and more preferably 3,000 to 10,000 ppm.

The composition according to the present invention contains a specific amount of a specific carboxylic acid compound, thereby suppressing the wrinkles of the cured film and producing an effect of improving the smoothness of the pattern surface. Although not desiring to be bound by theory, this is considered to be due to the following.

The positive type polysiloxane composition is applied, exposed, developed with an alkaline developer, rinsed, and cured by heating. Although the developer is washed away by rinsing, an alkali component remaining in the film, particularly on the film surface, excessively accelerates the curing reaction on the film surface.

If a flood exposure process is added after rinsing, excessive acceleration of the curing reaction does not occur due to the flood exposure. Therefore, generation of the wrinkles is suppressed.

Since the composition according to the present invention contains a specific amount of a specific carboxylic acid compound, excessive acceleration of the curing reaction does not occur and generation of the wrinkles can be suppressed by neutralizing an alkali component with an alkali developer even if there is no flood exposure process.

In particular, when the carboxylic acid compound is a compound that can form a cyclic structure by an intramolecular dehydration reaction at a specific temperature, the silanol group of the polysiloxane is protected with the carboxylic acid group before heating for curing. However, since it is considered that stepwise curing occurs, that is, at the time of heating for curing, curing is performed from unprotected silanol groups, carboxylic acid compounds are converted into anhydrides and removed from the film, and unprotected silanol groups are then cured. Therefore, it is considered that the effect of suppressing the wrinkles becomes higher.

Alkali developers are classified into organic and inorganic types, and inorganic developers have a smaller molecular size compared with organic developers and can easily enter into the film during development, so that the amount of acid required for neutralization also becomes more. Therefore, when an inorganic developer is used, the content of the carboxylic acid compound is more.

(III) Diazonaphthoquinone Derivative

The composition according to the present invention comprises a diazonaphthoquinone derivative. The composition comprising the diazonaphthoquinone derivative forms a positive image that is removed by development when the exposed area becomes soluble in an alkaline developer. That is, the composition according to the present invention generally functions as a positive type photoresist composition. The diazonaphthoquinone derivative of the present invention is a compound in which naphthoquinone diazide sulfonic acid is ester-bonded to a compound having a phenolic hydroxy group, and the structure is not particularly limited but is preferably an ester compound with a compound having one or more phenolic hydroxy groups. As the naphthoquinone diazide sulfonic acid, 4-naphthoquinone diazide sulfonic acid or 5-naphthoquinone diazide sulfonic acid can be used. Since the 4-naphthoquinonediazide sulfonic acid ester compound has absorption in i-line (wavelength: 365 nm) region, it is suitable for i-line exposure. Further, the 5-naphthoquinonediazide sulfonic acid ester compound has absorption in a broad wavelength range and is therefore suitable for exposure in a broad wavelength range. It is preferable to select an a 4-naphthoquinone diazide sulfonic acid ester compound or a 5-naphthoquinone diazide sulfonic acid ester compound according to the wavelength to be exposed. A mixture of a 4-naphthoquinone diazide sulfonic acid ester compound and a 5-naphthoquinone diazide sulfonic acid ester compound can also be used.

The compound having a phenolic hydroxy is not particularly limited, but examples thereof include bisphenol A, BisP-AF, BisOTBP-A, Bis26B-A, BisP-PR, BisP-LV, BisP-OP, BisP-NO, BisP-DE, BisP-AP, BisOTBP-AP, TrisP-HAP, BisP-DP, TrisP-PA, BisOTBP-Z, BisP-FL, TekP-4HBP, TekP-4HBPA, TrisP-TC (trade name, manufactured by Honshu Chemical Industry Co., Ltd.).

As far as the addition amount of diazonaphthoquinone derivative is concerned, optimal amount thereof varies depending on the esterification ratio of naphthoquinone diazide sulfonic acid, or the physical properties of the polysiloxane used, the required photosensitivity, and the dissolution contrast between the exposed area and the unexposed area, but is preferably 1 to 20 parts by mass, and more preferably 2 to 15 parts by mass, based on 100 parts by mass of the total amount of polysiloxane. When the addition amount of the diazonaphthoquinone derivative is 1 part by mass or less, the dissolution contrast between the exposed area and the unexposed area is too low, and there is no realistic photosensitivity. Further, in order to obtain more excellent dissolution contrast, 2 parts by mass or more is preferable. On the other hand, when the addition amount of the diazonaphthoquinone derivative is more than 20 parts by mass, whitening of the coating film occurs due to poor compatibility between the polysiloxane and the quinonediazide compound, or colorless transparency of the cured film is sometimes lowered because coloring due to decomposition of the quinonediazide compound that occurs during thermal curing becomes remarkable. Further, since heat resistance of diazonaphthoquinone derivatives is inferior to that of polysiloxane, if the addition amount is increased, thermal decomposition causes deterioration of the electrical insulation of the cured film and outgassing, resulting sometimes in problems in subsequent processes. Furthermore, resistance of the cured film to a photoresist stripper, which is mainly composed of monoethanolamine or the like, is sometimes lowered.

(IV) Solvent

The solvent is not particularly limited as long as it uniformly dissolves or disperses the above-described polysiloxane and the carboxylic acid compound as well as the additives that are optionally added. Examples of the solvent that can be used in the present invention include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates such as propylene glycol monomethyl ether acetate (PGMEA), propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; alcohols, such as ethanol, propanol, butanol, hexanol, cyclohexanol, ethylene glycol and glycerin; esters, such as ethyl lactate, ethyl 3-ethoxypropionate, methyl 3-methoxypropionate; and cyclic esters, such as γ-butyrolactone. Such a solvent can be used alone or in combination of two or more of any of these, and the amount used thereof varies depending on coating method or requirement of the film thickness after the coating.

In consideration of the coating method to be adopted, the content of the solvent in the composition according to the present invention can be selected suitably according to the mass average molecular weight of polysiloxane to be used, its distribution and its structure. The composition according to the present invention comprises a solvent of generally 40 to 90 mass %, and preferably 60 to 80 mass %, based on the total mass of the composition.

The composition according to the present invention essentially comprises the above (I) to (IV), but further compounds can be optionally combined. These materials which can be combined are described below. In addition, the content of the components other than (I) to (IV) contained in the total composition is preferably 10 mass % or less, and more preferably 5 mass % or less, based on the total mass.

Silanol Condensation Catalyst

The composition according to the present invention can comprise a silanol condensation catalysts selected from the group consisting of a photoacid generator, a photobase generator, a photothermal acid generator, and a photothermal base generator. It is preferable that these are selected according to the polymerization reaction and the crosslinking reaction used in the cured film manufacturing process.

In addition, in the present invention, the photoacid generator does not include the above-described diazonaphthoquinone derivative (III).

As far as these contents are concerned, optimal amounts thereof vary depending on type of the active substance generated by decomposition, the amount generated, and the required photosensitivity/dissolution contrast between the exposed area and the unexposed area, but are preferably 0.1 to 10 parts by mass, and more preferably 0.5 to 5 parts by mass, based on 100 parts by mass of the total mass of polysiloxane. When the addition amount is less than 0.1 parts by mass, the amount of acid or base to be generated is too small and pattern reflow easily occurs. On the other hand, when the addition amount is more than 10 parts by mass, the cured film to be formed may be cracked, or prominently colored due to decomposition thereof, which sometimes invites reduction of the colorless transparency of the cured film. Further, when the addition amount is increased, this may cause deterioration of electrical insulation of the cured film and outgassing due to thermal decomposition, which sometimes become a problem in the subsequent processes. Furthermore, resistance of the cured film to a photoresist stripper, which is mainly composed of monoethanolamine or the like, is sometimes lowered.

In the present invention, the photoacid generator or photobase generator refers to a compound that generates an acid or base by causing bond cleavage upon exposure to light. The generated acid or base is considered to contribute to the polymerization of the polysiloxane. Here, examples of the light include visible light, ultraviolet ray, infrared ray, X ray, electron beam, α ray, γ ray, and the like.

The photoacid generator or photobase generator preferably generates an acid or base through not an image-wise exposure for projecting a pattern (hereinafter referred to as the first exposure) but the flood exposure that is subsequently performed, and preferably has small less absorption at the wavelength of at the time of first exposure. For example, when the first exposure is performed with g-line (peak wavelength: 436 nm) and/or h-line (peak wavelength: 405 nm) and the wavelength at the time of second exposure is changed to g+h+i lines (peak wavelength: 365 nm), the photoacid generator or photobase generator preferably has a greater absorbance at wavelength of 365 nm than that at 436 nm and/or 405 nm.

Specifically, the absorbance at wavelength of 365 nm/absorbance at wavelength of 436 nm or the absorbance at wavelength of 365 nm/absorbance at wavelength of 405 nm is preferably 2 or more, more preferably 5 or more, further preferably 10 or more, and most preferably 100 or more.

Here, the UV-visible absorption spectrum is measured using dichloromethane as the solvent. The measuring device is not particularly limited, but examples thereof include Cary 4000 UV-Vis spectrophotometer (manufactured by Agilent Technologies Japan, Ltd.).

The photoacid generator can be freely selected from generally used ones and includes diazomethane compounds, triazine compounds, sulfonic acid esters, diphenyliodonium salts, triphenylsulfonium salts, sulfonium salts, ammonium salts, phosphonium salts, sulfonimide compounds, and the like.

Exemplified embodiments of the photoacid generator that can be used, including those described above, are 4-methoxyphenyl diphenyl sulfonium hexafluorophosphonate, 4-methoxyphenyl diphenyl sulfonium hexafluoroarsenate, 4-methoxyphenyl diphenyl sulfonium methane sulfonate, 4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsenate, 4-methoxyphenyl diphenyl sulfonium-p-toluene sulfonate, 4-phenyl thiophenyl diphenyl tetrafluoroborate, 4-phenyl thiophenyl diphenyl hexafluorophosphonate, triphenyl sulfonium methanesulfonate, triphenylsulfonium trifluoroacetate, triphenylsulfonium-p-toluenesulfonate, 4-methoxyphenyl diphenylsulfonium tetrafluoroborate, 4-phenylthiophenyl diphenyl hexafluoroarsenate, 4-phenylthiophenyl diphenyl-p-toluenesulfonate, N-(trifluoromethylsulfonyloxy)succinimide, N-(trifluoromethylsulfonyloxy)phthalimide, 5-norbornene-2,3-dicarboximidyl triflate, 5-norbornene-2,3-dicarboximidyl-p-toluenesulfonate, 4-phenylthiophenyldiphenyltrifluoromethanesulfonate, 4-phenylthiophenyl diphenyl trifluoroacetate, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-naphthylimide, N-(nonafluorobutylsulfonyloxy)naphthyl-imide, and the like.

Furthermore, when absorption of h-line is not desired, use of 5-propylsulfonyloxyimino-5H-thiophen-2-ylidene-(2-met hylphenyl)acetonitrile, 5-octylsulfonyl-oxyimino-5H-thiophene-2-ylidene-(2-met hylphenyl)-acetonitrile, 5-camphorsulfonyloxyimino-5H-thiophene-2-ylidene-(2-methylphenyl)acetonitrile, 5-methylphenyl-sulfonyloxyimino-5H-thiophene-2-ylidene-(2-methyl-phenyl)acetonitrile should be avoided, since they have absorption in the wavelength region of h-line.

Examples of the photobase generator include multi-substituted amide compounds having an amide group, lactams, imide compounds or those containing the structure thereof.

Further, an ionic photobase generator including an amide anion, a methide anion, a borate anion, a phosphate anion, a sulfonate anion, a carboxylate anion, and the like as an anion can also be used.

In the present invention, the photothermal acid generator or photothermal base generator refers to a compound that changes its chemical structure but does not generate an acid or base upon exposure to light, and then causes a bond cleavage by heat to generate an acid or base. Among these, the photothermal base generator is preferred. As the photothermal base generator, one represented by the following general formula (II), more preferably hydrate or solvate thereof is mentioned. The compound represented by the general formula (II) inverts to cis-form by exposure to light and becomes unstable, so that the decomposition temperature decreases and the base is generated even if the baking temperature is about 100° C. in the subsequent process.

The photothermal base generator does not need to be adjusted with the absorption wavelength of the diazonaphthoquinone derivative.

(II)

wherein, x is an integer of 1 or more and 6 or less, and $R^{a'}$ to $R^{f'}$ are each independently hydrogen, halogen, hydroxy, mercapto, sulfide, silyl, silanol, nitro, nitroso, sulfino, sulfo, sulfonato, phosphino, phosphinyl, phosphono, phosphonato, amino, ammonium, a $C_{1-20}$ aliphatic hydrocarbon group optionally having a substituent, a $C_{6-22}$ aromatic hydrocarbon group optionally having a substituent, a

$C_{1-20}$ alkoxy optionally having a substituent, or a $C_{6-20}$ aryloxy group optionally having a substituent.

Among these, for $R^{a'}$ to $R^{d'}$, particularly hydrogen, hydroxy, a $C_{1-6}$ aliphatic hydrocarbon group, or $C_{1-6}$ alkoxy is preferable, and for $R^{e'}$ and $R^{f'}$, particularly hydrogen is preferable. Two or more of $R^{a'}$ to $R^{d'}$ can be bonded to form a cyclic structure. At this time, the cyclic structure can contain a hetero atom.

N is a constituent atom of a nitrogen-containing heterocyclic ring, the nitrogen-containing heterocyclic ring is a 3- to 10-membered ring, and the nitrogen-containing heterocyclic ring can further have a $C_{1-20}$-, in particular $C_{1-6}$-, aliphatic hydrocarbon group, which can contain one or more substituents that are different from $C_xH_{2x}OH$ shown in the formula (II).

It is preferred that $R^{a'}$ to $R^{d'}$ are appropriately selected according to the exposure wavelength to be used. In display applications, for example, unsaturated hydrocarbon bonding functional groups such as vinyl and alkynyl which shift the absorption wavelength to g-, h- and i-line, alkoxy, nitro and the like are used, and particularly methoxy and ethoxy are preferred.

Specifically, the followings can be included.

In the present invention, the thermal acid generator or thermal base generator refers to a compound that causes bond cleavage by heat to generate an acid or base. It is preferable that these generate neither acid nor base by heat during pre-baking after application of the composition or generate only a small amount.

Examples of the thermal acid generator include salts and esters that generate organic acids, such as various aliphatic sulfonic acids and salts thereof; various aliphatic carboxylic acids such as citric acid, acetic acid and maleic acid, and salts thereof; various aromatic carboxylic acids such as benzoic acid and phthalic acid, and salts thereof; aromatic sulfonic acids and ammonium salts thereof; various amine salts; aromatic diazonium salts; and phosphonic acids and salts thereof, provided that the thermal acid generator used for the present invention does not include above mentioned (II) carboxylic acid compound. Among the thermal acid generators, in particular, a salt composed of an organic acid and an organic base is preferred, and a salt composed of sulfonic acid and an organic base is further preferred. Preferred sulfonic acids include p-toluenesulfonic acid, benzenesulfonic acid, p-dodecylbenzenesulfonic acid, 1,4-naphthalene-disulfonic acid, methanesulfonic acid, and the like. These acid generators can be used alone or in combination.

Examples of the thermal base generator include a compound that generates a base, such as imidazole, tertiary amine and quaternary ammonium, and mixtures thereof. Examples of the base to be released include imidazole derivatives such as N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole and N-(4-chloro-2-nitrobenzyloxycarbonyl)imidazole, and 1,8-diazabicyclo[5.4.0]undecene-7. Similarly to the acid generators, these base generators can be used alone or in combination.

As the other additives, surfactants, developer dissolution accelerators, scum removers, adhesion enhancers, polymerization inhibitors, antifoaming agents, and sensitizers are mentioned.

Since the surfactant can improve coating properties, using it is preferable. Examples of the surfactant that can be used in the polysiloxane composition in the present invention include nonionic surfactants, anionic surfactants, amphoteric surfactants, and the like.

Examples of the above-described nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; acetylene alcohol derivatives, such as polyethoxylate of acetylene alcohol; acetylene glycol derivatives, such as polyethoxylate of acetylene glycol; fluorine-containing surfactants, such as Fluorad (trade name, manufactured by 3M Japan Limited), Megafac (trade name, manufactured by DIC Corporation), Surufuron (trade name, AGC Inc.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the compounding ratio thereof is usually 50 to 10,000 ppm, preferably 100 to 5,000 ppm, based on the total mass of the composition.

The developer dissolution accelerator or scum remover adjusts solubility of the formed coating film in the developer and has action of preventing scum from remaining on the substrate after development. As such an additive, crown ether can be used.

The addition amount thereof is preferably 0.05 to 15 parts by mass, more preferably 0.1 to 10 parts by mass, with respect to 100 parts by mass of the total mass of the polysiloxane.

Further, a sensitizer can be added as necessary. Coumarins, ketocoumarins and their derivatives, acetophenones, as well as sensitizing dyes such as pyrylium salts and thiopyrylium salts, and anthracene skeleton-containing compounds can be included.

When a sensitizer is used, the addition amount thereof is preferably 0.01 to 5 parts by mass with respect to 100 parts by mass of the total mass of the polysiloxane.

As a polymerization inhibitor, nitrone, nitroxide radical, hydroquinone, catechol, phenothiazine, phenoxazine, hindered amine and derivatives thereof and an ultraviolet absorber can be added. The addition amount thereof is preferably 0.01 to 20 parts by mass with respect to 100 parts by mass of the total mass of the polysiloxane.

As the antifoaming agent, alcohols ($C_{1-18}$), higher fatty acids such as oleic acid and stearic acid, higher fatty acid esters such as glycerin monolaurate, polyethers such as polyethylene glycols (PEG) (Mn: 200 to 10,000) and polypropylene glycols (PPG) (Mn: 200 to 10,000), silicone compounds such as dimethyl silicone oil, alkyl-modified silicone oil and fluorosilicone oil, and organosiloxane-based surfactants are mentioned. These can be used alone or in combination of a plurality of these. The addition amount thereof is preferably 0.1 to 3 parts by mass with respect to 100 parts by mass of the total mass of the polysiloxane.

The adhesion enhancer has an effect of preventing a pattern from being peeled off by stress applied after curing when a cured film is formed using the composition according to the present invention. As the adhesion enhancer, imidazoles and silane coupling agents are preferable.

These other additives can be used alone or in combination of a plurality of these, and the addition amount thereof is 20 parts by mass or less, preferably 0.05 to 15 parts by mass, with respect to 100 parts by mass of the total mass of the polysiloxane.

Method for Manufacturing Cured Film

The method for manufacturing a cured film according to the present invention comprises the following processes:
(1) applying the composition according to the present invention on a substrate to form a composition layer;
(2) exposing the composition layer;
(3) developing with an alkaline developer to form a pattern; and
(4) heating the obtained pattern.

Following is description given in process order:

(1) Application Process

First, the above-described composition is applied on a substrate. Formation of the coating film of the composition in the present invention can be carried out by any method conventionally known as a method for applying a photosensitive composition. Specifically, it can be freely selected from dip coating, roll coating, bar coating, brush coating, spray coating, doctor coating, flow coating, spin coating, slit coating and the like.

Further, as the substrate on which the composition is applied, a suitable substrate such as a silicon substrate, a glass substrate, a resin film, or the like can be used. Various semiconductor devices and the like can be formed on these substrates as needed. When the substrate is a film, gravure coating can also be utilized. If desired, a drying process can be additionally provided after applying the film. Further, if necessary, the applying process can be repeated once or twice or more to make the film thickness of the coating film to be formed as desired.

After forming the coating film of the composition by applying the composition, it is preferable to carry out pre-baking (heat treatment) of the coating film in order to dry the coating film and reduce the remaining amount of the solvent in the coating film. The pre-baking process can be carried out at a temperature of generally 70 to 150° C., preferably 90 to 120° C., in the case of a hot plate, for 10 to 300 seconds, preferably 30 to 120 seconds and in the case of a clean oven, for 1 to 30 minutes.

(2) Exposure Process

After forming a coating film, the coating film surface is then irradiated with light. In this regard, in order to distinguish from the flood exposure to be described later, this process is sometimes referred to as the first exposure. As a light source to be used for the light irradiation, any one conventionally used for a pattern forming method can be used. As such a light source, a high-pressure mercury lamp, a low-pressure mercury lamp, a lamp such as metal halide and xenon, a laser diode, an LED and the like can be included. Ultraviolet ray such as g-line, h-line and i-line is usually used as the irradiation light. Except ultrafine processing for semiconductors or the like, it is general to use light of 360 to 430 nm (high-pressure mercury lamp) for patterning of several μm to several dozens of μm. Above all, in the case of liquid crystal display devices, light of 430 nm is often used. In such a case, as described above, it is advantageous to combine a sensitizing dye with the composition according to the present invention.

The energy of the irradiation light is generally 5 to 2,000 $mJ/cm^2$, preferably 10 to 1,000 $mJ/cm^2$, although it depends on the light source and the film thickness of the coating film. If the irradiation light energy is lower than 5 $mJ/cm^2$, sufficient resolution cannot be obtained in some cases. On the other hand, when the irradiation light energy is higher than 2,000 $mJ/cm^2$, the exposure becomes excess and occurrence of halation is sometimes brought.

In order to irradiate light in a pattern shape, a general photomask can be used. Such a photomask can be freely selected from well-known ones. The environment at the time of irradiation is not particularly limited, but it can generally be set as an ambient atmosphere (in the air) or nitrogen atmosphere. Further, in the case of forming a film on the entire surface of the substrate, light irradiation can be performed over the entire surface of the substrate. In the present invention, the pattern film also includes such a case where a film is formed on the entire surface of the substrate.

(3) Developing Process

After the exposure, the coating film is developed. As the developer used at the time of the development, any developer conventionally used for developing a photosensitive composition can be used. The developer includes an organic developer and an inorganic developer, and examples of the organic developer include a TMAH aqueous solution, a tetrabutylammonium hydroxide aqueous solution, methyl isobutyl ketone and isopropyl alcohol, preferably a TMAH aqueous solution, and more preferably, a 2.38 mass % TMAH aqueous solution. As the inorganic developer, alkali metal salts are included, and preferably a potassium hydroxide aqueous solution or a sodium hydroxide aqueous solution, a sodium carbonate aqueous solution, a sodium bicarbonate aqueous solution, a sodium silicate aqueous solution, a sodium metasilicate aqueous solution, aqueous ammonia, and particularly preferably a potassium hydroxide aqueous solution are included. When a potassium hydroxide aqueous solution is used, this concentration is preferably 0.1 to 3.0 mass %, and more preferably 0.5 to 2.0 mass %. In the alkali developer, a water-soluble organic solvent such as methanol and ethanol, or a surfactant can be further contained, if necessary.

The developing method can also be freely selected from conventionally known methods. Specifically, methods such as dipping in a developer (dip), paddle, shower, slit, cap coat, spray and the like can be included. The development temperature is preferably a normal temperature (20 to 25° C.), but can be heated to 30 to 50° C. The development time is preferably 15 to 180 seconds, and more preferably 30 to 60 seconds. By the development, a pattern can be obtained, and it is preferable that rinsing (washing with water) is conducted after the development is performed with a developer.

The rinsing is preferably conducted using water, and can be conducted in the same manner as the development, and is conducted preferably by showering for 60 seconds or more.

It is common to perform a flood exposure process after development (and optionally rinsing). As described above, this is because formation of the wrinkles in the cured film can be suppressed by performing the flood exposure. In addition to this, by performing the flood exposure, the unreacted diazonaphthoquinone derivative remaining in the film is photodegraded, thereby further increasing the optical transparency of the film; therefore, it is preferable to perform the flood exposure process when transparency is required. As the method of the flood exposure, there is a method for exposing light over the entire surface with about 100 to 2,000 mJ/cm$^2$ (in terms of exposure amount at wavelength of 365 nm) using an ultraviolet visible exposure machine PLA (for example, PLA-501F, manufactured by Canon Inc.).

When the composition according to the present invention is used, wrinkles can be suppressed without performing the flood exposure, and therefore, it is not always needed to perform the flood exposure when excessive transparency is not required.

(4) Curing Process

After development, the obtained pattern film is cured by heating. The heating temperature in this process is not particularly limited as long as it is a temperature at which curing of the coating film can be performed and can be freely determined. However, if the silanol group remains, the chemical resistance of the cured film sometimes becomes insufficient, or dielectric constant of the cured film sometimes becomes higher. From such a viewpoint, a relatively high temperature is generally selected as the heating temperature. Specifically, it is preferable to cure by heating at 360° C. or lower, and in order to keep the remaining film ratio after curing high, the curing temperature is more preferably 300° C. or lower, and particularly preferably 250° C. or lower. On the other hand, in order to accelerate the curing reaction and obtain a sufficiently cured film, the curing temperature is preferably 70° C. or higher, more preferably 90° C. or higher, and particularly preferably 100° C. or higher. Further, the heating time is not particularly limited and is generally 10 minutes to 24 hours, and preferably 30 minutes to 3 hours. In addition, this heating time is a time from when the temperature of the pattern film reaches a desired heating temperature. Usually, it takes about several minutes to several hours for the pattern film to reach a desired temperature from the temperature before heating.

Figure 1:
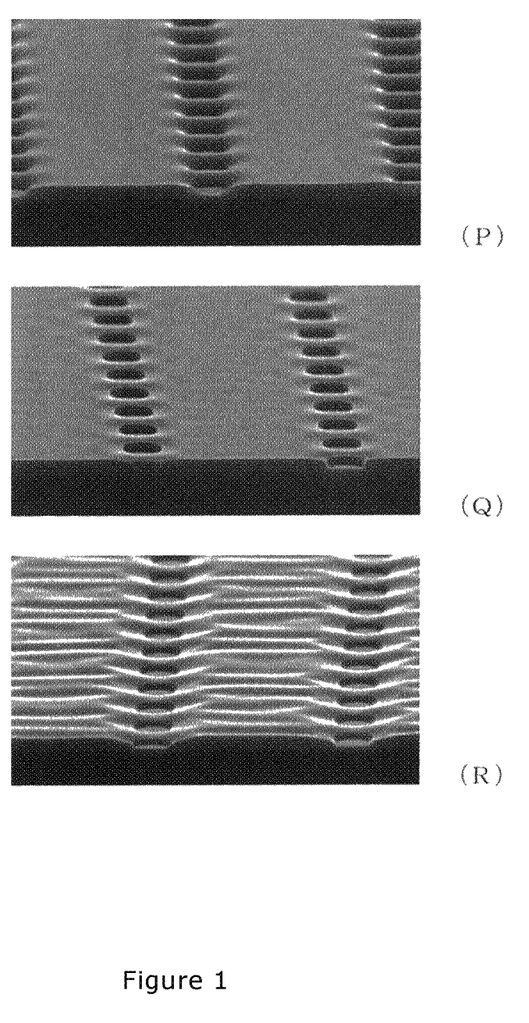
FIG. 1 Electron microscope photographs for explaining the "wrinkles" formed on a pattern surface.

Using the composition according to the present invention, the wrinkles generated on the surface of the cured film in this curing process can be suppressed. Here, the wrinkle means unevenness which generates in the vicinity of or at a portion away from the pattern part of a cured film. FIG. 1 shows electron micrograph photographs of typical wrinkles formed on a pattern surface.

The rough indication of the difference among no wrinkles (FIG. 1 (P)), small wrinkles (FIG. 1 (Q)) and large wrinkles (FIG. 1 (R)) is that when with respect to a distance of 1.5 cm, the film surface is measured at a portion away from the pattern after curing, with a force of 3 mg over 50 seconds using a stylus type surface measuring device (Dektak), the surface unevenness means as follows:

no wrinkles: level difference of about lower than 30 nm;
small wrinkles: level difference of about 30 nm to 100 nm; and
large wrinkles: level difference of larger than 100 nm.

The cured film thus obtained can achieve excellent flatness, electrical insulation properties, and the like. For example, the relative dielectric constant of 4 or less can also be achieved. For this reason, it can be suitably utilized in many fields as a planarization film for the above-described various devices such as a flat panel display (FPD), an interlayer insulating film for low temperature polysilicon or a buffer coat film for IC chip, a transparent protective film, and the like.

The present invention is explained more specifically below by use of Examples and Comparative Examples, but the present invention is not limited by these Examples and Comparative Examples at all.

Gel permeation chromatography (GPC) was measured using two columns of HLC-8220 GPC type high-speed GPC system (trade name, manufactured by Tosoh Corporation) and Super Multipore HZ-N type GPC column (trade name, manufactured by Tosoh Corporation). The measurement was performed using monodisperse polystyrene as a standard sample and tetrahydrofuran as an eluent, under the analytical conditions of a flow rate of 0.6 ml/min and a column temperature of 40° C.

Synthesis Example 1 (Synthesis of Polysiloxane Pa-1)

Into a 2 L flask equipped with a stirrer, a thermometer, and a condenser tube, 49.0 g of a 25 mass % TMAH aqueous solution, 600 ml of isopropyl alcohol (IPA) and 4.0 g of water were charged, and then a mixed solution of 68.0 g of methyltrimethoxysilane, 79.2 g of phenyltrimethoxysilane and 15.2 g of tetramethoxysilane was prepared in a dropping funnel. The mixed solution was added dropwise at 40° C., and the resulting product was stirred at the same temperature for 2 hours and then neutralized by adding a 10 mass % HCl aqueous solution. To the neutralized liquid, 400 ml of toluene and 600 ml of water were added to separate the resulting product into two phases, and the aqueous phase was removed. Furthermore, the resulting product was washed three times with 300 ml of water, the obtained organic phase was concentrated under reduced pressure to remove the solvent, and PGMEA was added to the concentrate to prepare a solid content concentration of 35 mass %.

When the molecular weight (in terms of polystyrene) of the obtained polysiloxane was measured by gel permeation chromatography, the mass average molecular weight (hereinafter sometimes abbreviated as "Mw") was 1,700. Further, the obtained resin solution was applied on a silicon wafer using a spin coater (MS-A100, manufactured by Mikasa Co., Ltd.) to make the film thickness after pre-baking become 2 µm, and when the dissolution rate (hereinafter sometimes abbreviated as "ADR") to a 2.38 mass % TMAH aqueous solution was measured after pre-baking, it was 1,200 Å/sec.

Synthesis Example 2 (Synthesis of Polysiloxane Pa-2)

Synthesis was performed in the same manner as in Synthesis Example 1 except that the amount of the TMAH aqueous solution was changed to 32.5 g.

The obtained Polysiloxane Pa-2 had Mw=2,500 and ADR=300 Å/sec for a 5 mass % TMAH aqueous solution after pre-baking.

Synthesis Example 3 (Synthesis of Polysiloxane Pb-1)

Into a 2 L flask equipped with a stirrer, a thermometer and a condenser tube, 102 g of a 25 mass % TMAH aqueous solution, 600 ml of IPA and 4.0 g of water were charged with, and then in a dropping funnel, a mixed solution of 68.0 g of methyltrimethoxysilane, 79.2 g of phenyltrimethoxysilane and 68.1 g of bis(triethoxysilyl)methane was prepared. The mixed solution was added dropwise at 40° C., and the mixture was stirred at the same temperature for 2 hours, and then neutralized by adding a 10 mass % HCl aqueous solution. To the neutralized liquid, 400 ml of toluene and 600 ml of water were added to separate the resulting product into two phases, and the aqueous phase was removed. Further, the resulting product was washed 3 times with 400 ml of water, the obtained organic phase was concentrated under reduced pressure to remove the solvent, and PGMEA was added to the concentrate to prepare a solid content concentration of 35 mass %.

The obtained Polysiloxane Pb-1 had Mw=6,500, and ADR=3,300 Å/sec for a 2.38 mass % TMAH aqueous solution after pre-baking.

Synthesis Example 4 (Synthesis of Polysiloxane Pb-2)

Into a 2 L flask equipped with a stirrer, a thermometer and a condenser tube, 102 g of a 25 mass % TMAH aqueous solution, 600 ml of isopropyl alcohol (IPA) and 4.0 g of water were charged, and then in a dropping funnel, a mixed solution of 68.0 g of methyltrimethoxysilane, 79.2 g of phenyltrimethoxysilane and 54.0 g of bis(trimethoxysilyl)ethane was prepared. The mixed solution was added dropwise at 40° C., and the mixture was stirred at the same temperature for 2 hours, and then neutralized by adding a 10 mass % HCl aqueous solution. To the neutralized liquid, 400 ml of toluene and 600 ml of water were added to separate the resulting product into two phases, and the aqueous phase was removed. Further, the resulting product was washed 3 times with 400 ml of water, the obtained organic phase was concentrated under reduced pressure to remove the solvent, and PGMEA was added to the concentrate to prepare a solid content concentration of 35 mass %.

The obtained polysiloxane had Mw=9,000, and ADR=2,600 Å/sec for a 2.38 mass % TMAH aqueous solution after prebaking.

Further, ADR of the whole polysiloxane for the 2.38 mass % TMAH aqueous solution after prebaking were as follows:

ADR of Polysiloxane (Pa-1:Pa-2:Pb-1=40:10:50)=1,800 Å/sec,
ADR of Polysiloxane (Pa-1:Pa-2:Pb-2=40:10:50)=1,600 Å/sec, and
ADR of Polysiloxane (Pa-1:Pa-2=90:10)=900 Å/sec.

Examples 101 to 114 and Comparative Examples 101 to 108 (Preparation of Positive Type Photosensitive Polysiloxane Compositions)

The positive type photosensitive polysiloxane compositions of Examples 101 to 114 and Comparative Examples 101 to 108 containing the compounds shown in Table 1 below and the balance being PGMEA were prepared.

TABLE 1

| | | Composition | | | | | | | Evaluation | |
|---|---|---|---|---|---|---|---|---|---|---|
| | | Polysiloxane (parts by mass) | | | | Diazonaphthoquinone derivative | Carboxylic acid compound | | Surfactant | Evaluation | Evaluation of pattern |
| | | Pa-1 | Pa-2 | Pb-1 | Pb-2 | (parts by mass) | (ppm) | | (ppm) | of wrinkles | shape |
| Example | 101 | 40 | 10 | — | 50 | 6 | Maleic acid | 300 | 1000 | B | Y |
| | 102 | 40 | 10 | — | 50 | 6 | Maleic acid | 500 | 1000 | A | Y |
| | 103 | 40 | 10 | — | 50 | 6 | Maleic acid | 1000 | 1000 | A | Y |
| | 104 | 40 | 10 | — | 50 | 6 | Maleic acid | 12000 | 1000 | A | X |
| | 105 | 40 | 10 | — | 50 | 6 | Maleic acid | 50000 | 1000 | A | X |
| | 106 | 40 | 10 | 50 | — | 6 | Maleic acid | 1000 | 1000 | A | X |
| | 107 | 40 | 10 | 50 | — | 6 | Maleic acid | 500 | 1000 | A | X |
| | 108 | 50 | — | — | 50 | 6 | Maleic acid | 500 | 1000 | A | X |
| | 109 | 90 | 10 | — | — | 6 | Maleic acid | 1000 | 1000 | A | X |

TABLE 1-continued

| | | Composition | | | | | | Evaluation | |
|---|---|---|---|---|---|---|---|---|---|
| | | Polysiloxane (parts by mass) | | | | Diazonaphthoquinone derivative | Carboxylic acid compound | Surfactant | Evaluation | Evaluation of pattern |
| | | Pa-1 | Pa-2 | Pb-1 | Pb-2 | (parts by mass) | (ppm) | (ppm) | of wrinkles | shape |
| | 110 | 90 | 10 | — | — | 6 | Maleic acid 9000 | 1000 | A | X |
| | 111 | 40 | 10 | — | 50 | 6 | Acetic acid 10000 | 1000 | B | X |
| | 112 | 40 | 10 | — | 50 | 6 | Oxalic acid 3000 | 1000 | A | Z |
| | 113 | 40 | 10 | — | 50 | 6 | Malonic acid 3000 | 1000 | A | Y |
| | 114 | 40 | 10 | — | 50 | 6 | Malic acid 3000 | 1000 | A | Z |
| Comparative Example | 101 | 40 | 10 | 50 | — | 6 | — | 1000 | D | Z |
| | 102 | 40 | 10 | 50 | — | 6 | Maleic acid 100 | 1000 | C | Z |
| | 103 | 40 | 10 | — | 50 | 6 | — | 1000 | D | Z |
| | 104 | 40 | 10 | — | 50 | 6 | Maleic acid 100 | 1000 | C | Z |
| | 105 | 90 | 10 | — | — | 6 | — | 1000 | D | X |
| | 106 | 90 | 10 | — | — | 6 | Maleic acid 100 | 1000 | C | X |
| | 107 | 40 | 10 | — | 50 | 6 | Citric acid 300 | 1000 | D | Z |
| | 108 | 40 | 10 | — | 50 | 6 | Citric acid 10000 | 1000 | D | Z |

In the table, diazonaphthoquinone derivative: modified 4,4'-(1-(4-(1-(4-hydroxyphenyl)-1-methylethyl)phenyl)-ethylidene)bisphenol with 2.0 mol of diazonaphthoquinone
surfactant: KF-53, manufactured by Shin-Etsu Chemical Co., Ltd.

Further, "—" means that the addition amount was zero.

Evaluation of Wrinkles

The wrinkle state on the surface after curing, which was exposed with the optimal exposure amount obtained in the photosensitivity evaluation, was visually observed and evaluated. The evaluation criteria are as follows, and the evaluation results are as described in Table 1.
A: wrinkles were not confirmed on the surface
B: although small wrinkles were confirmed on the surface, the portions where no wrinkles were confirmed were 80% or more
C: small wrinkles on the surface were confirmed, and the portions where no wrinkles were confirmed were less than 80%
D: large wrinkles were confirmed on the surface In addition, typical electron microscope photographs of a pattern (P) in which no wrinkles were confirmed, a pattern (Q) having small wrinkles, and a pattern (R) having large wrinkles are shown in FIG. 1.

Evaluation of Pattern Shape

Figure 2:
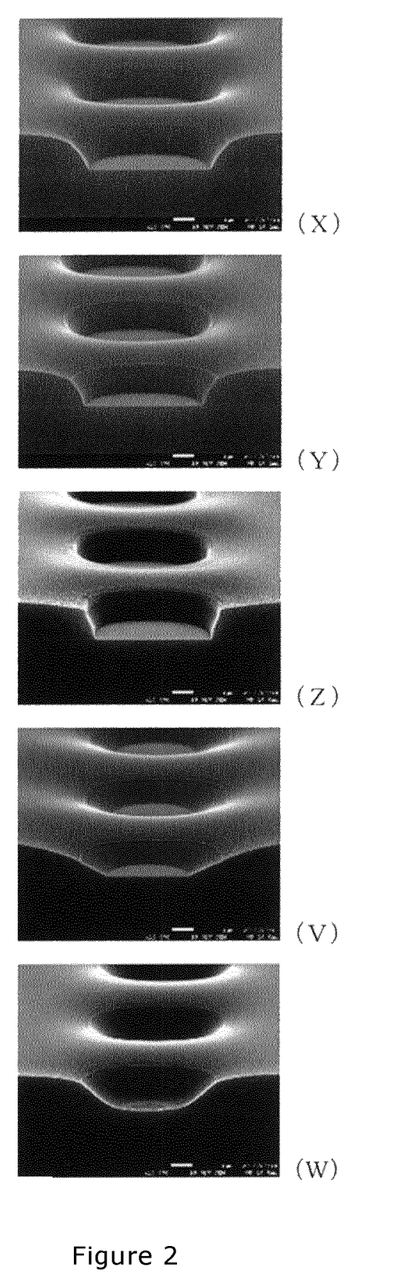
FIG. 2 Electron microscope photographs for explaining the pattern shape in Examples.

The shape of the pattern after curing, which was exposed with the optimal exposure obtained in the photosensitivity evaluation, was observed and evaluated using a scanning electron microscope (SEM). The evaluation criteria are as follows, and the evaluation results are as described in FIG. 1.
X: the corners of the formed pattern were greatly rounded
Y: the corners of the formed pattern were rounded
Z: the corners of the formed pattern were not rounded
V: the missing pattern was smaller than the mask size
W: no pattern was formed In addition, respective typical electron microscope photographs that correspond to the above-described shapes are shown in FIG. 2.

Evaluation of Photosensitivity

The compositions of Examples 101 to 105 were applied by spin coating so that the film thickness after pre-baking was 1.6 μm. The obtained coating film was subjected to pre-baking at 110° C. for 90 seconds to volatilize the solvent. Thereafter, a contact hole having a size of 5 μm was pattern-exposed with an optimal exposure amount using a g+h lines mask aligner (FX-604F type, manufactured by Nikon Corporation). After exposure, paddle development was performed for 70 seconds using a 2.38 mass % TMAH aqueous solution, followed by rinsing with pure water for 60 seconds and drying. Then, after heating at 180° C. in the air for 20 minutes, it was further heated at 230° C. for 20 minutes to be cured. Here, the exposure amount at which the bottom width of the contact hole after curing when patterned with a 5 micron mask was 5 microns was determined as the optimal exposure amount.

In the compositions of Examples 101 to 105, the exposure amount of less than 500 mJ was the optimal exposure amount, and the photosensitivity was sufficient for practical use.

On the other hand, using the same composition as in Example 101 except that maleic acid was 80,000 ppm, the optimal exposure amount was determined in the same manner as described above, but no pattern could be formed even when the exposure amount was increased.

Examples 201 and 202 and Comparative Examples 201 to 204 (Preparation of Positive Type Photosensitive Polysiloxane Compositions)

The positive type photosensitive polysiloxane compositions of Examples 201 and 202 and Comparative Examples 201 to 204 containing the compounds shown in Table 2 below and the balance being PGMEA were prepared.

TABLE 2

| | | Composition | | | | | | Evaluation | |
|---|---|---|---|---|---|---|---|---|---|
| | | Polysiloxane (parts by mass) | | | Diazonaphthoquinone derivative | Carboxylic acid compound | Surfactant | Evaluation of wrinkles | Evaluation of pattern shape |
| | | Pa-1 | Pa-2 | Pb-2 | (parts by mass) | (ppm) | (ppm) | | |
| Example | 201 | 40 | 10 | 50 | 6 | Maleic acid 3000 | 1000 | A | X |
| | 202 | 90 | 10 | — | 6 | Maleic acid 10000 | 1000 | A | X |
| Comparative Example | 201 | 90 | 10 | — | 6 | — | 1000 | D | X |
| | 202 | 40 | 10 | 50 | 6 | — | 1000 | D | Z |
| | 203 | 90 | 10 | — | 6 | Citric acid 3000 | 1000 | D | X |
| | 204 | 90 | 10 | — | 6 | Malic acid 3000 | 1000 | D | X |

In the table, diazonaphthoquinone derivative: modified 4,4'-(1-(4-(1-(4-hydroxyphenyl)-1-methylethyl)phenyl)-ethylidene)bisphenol with 2.0 mol of diazonaphthoquinone surfactant: KF-53, manufactured by Shin-Etsu Chemical Co., Ltd.

Further, "-" means that the addition amount was zero.

Each composition was applied by spin coating so that the film thickness after pre-baking was 1.6 μm. The obtained coating film was subjected to pre-baking at 110° C. for 90 seconds to volatilize the solvent. Thereafter, a contact hole having a size of 5 μm was pattern-exposed with an optimal exposure amount using a g+h lines mask aligner (FX-604F type, manufactured by Nikon Corporation). After exposure, paddle development was performed for 70 seconds using a 1.0 mass % KOH aqueous solution, followed by rinsing with pure water for 60 seconds and drying. Then, after heating at 180° C. in the air for 20 minutes, it was further heated at 230° C. for 20 minutes to be cured.

Evaluation of wrinkles and evaluation of pattern shape were conducted according to the same evaluation criteria as described above. The evaluation results are as described in Table 2.

The invention claimed is:

1. A positive type photosensitive polysiloxane composition comprising:
    (I) a polysiloxane,
    wherein the polysiloxane further comprises a repeating unit represented by the following formula (Ie):

(Ie)

wherein,
$L^{Ie}$ is $-(CR^{Ie}{}_{2})_{n}-$ or where, n is an integer of 1 to 3, and $R^{Ie}$ each independently represents hydrogen, methyl or ethyl,
    (II) a carboxylic acid compound that is a monocarboxylic acid or a dicarboxylic acid, of 200 to 50,000 ppm based on the total mass of the composition,
    (III) a diazonaphthoquinone derivative, and
    (IV) a solvent.

2. The composition according to claim 1, wherein the first acid dissociation constant $pKa_1$ of the monocarboxylic acid is 5.0 or less, and the first acid dissociation constant $pKa_1$ of the dicarboxylic acid is 4.0 or less.

3. The composition according to claim 1, wherein the monocarboxylic acid is represented by the formula (i):

$$R^i\text{—COOH} \qquad (i)$$

wherein,
$R^i$ is hydrogen, or a saturated or unsaturated $C_{1-4}$ hydrocarbon group, and the dicarboxylic acid is represented by the formula (ii):

$$\text{HOOC-L-COOH} \qquad (ii)$$

wherein,
L is a single bond,
    a $C_{1-6}$, unsubstituted alkylene, hydroxy-substituted alkylene or amino-substituted alkylene,
    a $C_{2-4}$, substituted or unsubstituted alkenylene,
    a $C_{2-4}$, substituted or unsubstituted alkynylene, or
    a $C_{6-10}$, substituted or unsubstituted arylene.

4. The composition according to claim 1, wherein the carboxylic acid compound is a dicarboxylic acid.

5. The composition according to claim 1, wherein the dicarboxylic acid can take a cyclic structure by intramolecular dehydration condensation.

6. The composition according to claim 1, wherein the content of the carboxylic acid compound is 300 to 30,000 ppm based on the total mass of the composition.

7. A method for manufacturing a cured film comprising the following processes:
    (1) applying the composition according to claim 1 on a substrate to form a composition layer;
    (2) exposing the composition layer;
    (3) developing with an alkaline developer to form a pattern; and
    (4) heating the obtained pattern.

8. The method according to claim 7, wherein a process of performing flood exposure is not included before the process (4).

9. The method according to claim 7, wherein the alkaline developer is an organic developer.

10. The method according to claim 7, wherein the alkaline developer is an inorganic developer.

11. An electronic device comprising a cured film manufactured by the method according to claim 1.

\* \* \* \* \*